US012631813B2

(12) United States Patent
Abe et al.

(10) Patent No.: US 12,631,813 B2
(45) Date of Patent: May 19, 2026

(54) POLYETHYLENE TEREPHTHALATE-BASED RESIN FILM, AND POLARIZER, TRANSPARENT CONDUCTIVE FILM, TOUCH PANEL, AND IMAGE DISPLAY DEVICE USING SAME

(71) Applicant: TOYOBO CO., LTD., Osaka (JP)

(72) Inventors: Takahisa Abe, Tsuruga (JP); Yuka Ikeda, Otsu (JP); Kaoru Sawada, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 591 days.

(21) Appl. No.: 18/249,933

(22) PCT Filed: Oct. 18, 2021

(86) PCT No.: PCT/JP2021/038409
§ 371 (c)(1),
(2) Date: Apr. 20, 2023

(87) PCT Pub. No.: WO2022/085623
PCT Pub. Date: Apr. 28, 2022

(65) Prior Publication Data
US 2023/0408734 A1     Dec. 21, 2023

(30) Foreign Application Priority Data

Oct. 23, 2020     (JP) ................................. 2020-178143

(51) Int. Cl.
| | |
|---|---|
| *G02B 5/30* | (2006.01) |
| *C08J 5/18* | (2006.01) |
| *G02B 1/14* | (2015.01) |
| *G02F 1/1335* | (2006.01) |
| *H10K 59/80* | (2023.01) |

(52) U.S. Cl.
CPC ............. *G02B 5/3083* (2013.01); *C08J 5/18* (2013.01); *B32B 2367/00* (2013.01); *B32B 2457/202* (2013.01); *B32B 2457/206* (2013.01); *C08J 2367/02* (2013.01); *C09K 2323/06* (2020.08); *G02B 1/14* (2015.01); *G02F 1/133528* (2013.01); *G02F 2201/50* (2013.01); *H10K 59/8791* (2023.02)

(58) Field of Classification Search
CPC ............. B32B 27/36; B32B 2457/202; B32B 2457/206; B32B 2367/00; C08J 5/18; C08J 2367/00; C08J 2367/02; C08J 2467/02; C09K 2323/06; G02B 5/3083
See application file for complete search history.

(56) References Cited

U.S. PATENT DOCUMENTS

| | | | |
|---|---|---|---|
| 5,858,507 | A | 1/1999 | Yoshida et al. |
| 9,798,189 | B2 | 10/2017 | Murata et al. |
| 9,897,857 | B2 | 2/2018 | Murata et al. |
| 10,503,016 | B2 | 12/2019 | Murata et al. |
| 2013/0100378 | A1 | 4/2013 | Murata et al. |
| 2017/0261794 | A1 | 9/2017 | Murata et al. |
| 2018/0173038 | A1 | 6/2018 | Murata et al. |
| 2019/0113791 | A1 | 4/2019 | Yamamoto et al. |

FOREIGN PATENT DOCUMENTS

| | | | | | |
|---|---|---|---|---|---|
| JP | 2002-116320 | A | 4/2002 | | |
| JP | 2004-205773 | A | 7/2004 | | |
| JP | 2004-219620 | A | 8/2004 | | |
| JP | 2020-052335 | A | 4/2020 | | |
| TW | 201741144 | A | 12/2017 | | |
| TW | I874718 | B | * 3/2025 | .......... | H10K 85/141 |
| WO | WO 2011/162198 | A1 | 12/2011 | | |
| WO | WO 2014/123210 | A1 | 8/2014 | | |
| WO | WO 2018/110625 | A1 | 6/2018 | | |
| WO | WO-2018181655 | A1 | * 10/2018 | ................ | C08J 5/18 |
| WO | WO 2019/054406 | A1 | 3/2019 | | |
| WO | WO 2020/067243 | A1 | 4/2020 | | |
| WO | WO-2020196306 | A1 | * 10/2020 | .......... | G02B 5/3033 |

OTHER PUBLICATIONS

Japan Patent Office, International Search Report in International Patent Application No. PCT/JP2021/038409 (Nov. 22, 2021).
European Patent Office, Extended European Search Report in European Patent Application No. 21882764.0 (Aug. 21, 2024).

* cited by examiner

*Primary Examiner* — Sophie Hon
(74) *Attorney, Agent, or Firm* — Leydig, Voit & Mayer, Ltd.

(57)     ABSTRACT

An object is to provide a polyethylene terephthalate-based resin film that has excellent processing suitability and that particularly can effectively suppress the occurrence of cleavage in the film layer of a portion cut with a knife. Another object is to provide a polarizer, a transparent conductive film, a touch panel, and image display devices such as a liquid crystal display device and an organic EL display device, all of which use the polyethylene terephthalate-based resin film. A polyethylene terephthalate-based resin film satisfying the following (1) and (2): (1) the polyethylene terephthalate-based resin film has a retardation of 3000 to 30000 nm; and (2) the polyethylene terephthalate-based resin film has an amorphous orientation parameter of 0.330 or more as measured by an ATR-FTIR method.

11 Claims, No Drawings

POLYETHYLENE TEREPHTHALATE-BASED RESIN FILM, AND POLARIZER, TRANSPARENT CONDUCTIVE FILM, TOUCH PANEL, AND IMAGE DISPLAY DEVICE USING SAME

TECHNICAL FIELD

The present invention relates to a polyethylene terephthalate-based resin film, and a polarizer, a transparent conductive film, a touch panel, and image display devices such as a liquid crystal display device and an organic EL display device, all of which use the polyethylene terephthalate-based resin film.

BACKGROUND ART

Polarizers used in liquid crystal display devices (LCDs) generally have a structure in which a polarizing film obtained by dyeing polyvinyl alcohol (PVA) etc. with iodine is sandwiched between two protective films. Triacetyl cellulose (TAO) films are commonly used as the protective films. Along with the recent trend of thinner LCDs, there is a demand for reducing the thickness of polarizers. However, when the thickness of TAC films used as protective films is reduced in order to satisfy this demand, problems such as insufficient mechanical strength and deteriorated moisture permeability occur. Moreover, TAC films are very expensive, and polyester films have been proposed as inexpensive alternative materials (Patent Literature 1 to Patent Literature 3), but have the problem that rainbow unevenness is observed.

When an oriented polyester film with birefringent properties is disposed on one side of a polarizing film, the state of linearly polarized light emitted from a backlight unit or polarizing film changes when the light passes through the polyester film. The transmitted light shows an interference color specific to the retardation of the oriented polyester film, which is the product of the birefringence and the thickness of the film. Accordingly, when cold-cathode tubes, hot-cathode tubes, or the like that have a discontinuous emission spectrum are used as a light source, the intensity of the transmitted light varies depending on the wavelength, causing rainbow unevenness.

As means for solving the above problems, it has been proposed to use a white light source having a continuous and wide emission spectrum, such as a white-light-emitting diode, as a backlight light source and further to use an oriented polyester film having a specific retardation as a protective film (Patent Literature 4). White-light-emitting diodes have a continuous and wide emission spectrum in the visible light region. Therefore, when focusing on the envelope curve shape of the interference color spectrum of light transmitted through a birefringent material, a spectrum similar to the emission spectrum of the light source can be obtained by controlling the retardation of the oriented polyester film, thereby suppressing rainbow unevenness.

CITATION LIST

Patent Literature

PTL 1: JP2002-116320A
PTL 2: JP2004-219620A
PTL 3: JP2004-205773A
PTL 4: WO2011/162198

SUMMARY OF INVENTION

Technical Problem

Polyethylene terephthalate-based resin films to which a specific retardation is imparted to suppress rainbow unevenness are used for various applications, such as protective films, base materials of transparent conductive films for touch panels, and surface cover films. However, it has been found that due to their high orientation anisotropy, cleavage tends to occur inside the films, which may reduce processing suitability. In particular, for the above applications, the films are often provided with functional layers, such as a hard coating layer, anti-reflection laver, low-reflection layer, anti-glare layer, light diffusion layer, lens layer, and prismatic layer, or laminated with other materials for use as laminated films. These laminated films are coated with functional layers or bonded with other materials through adhesives, and then cut with knives at various stages before being incorporated into final products, such as slitting the edges, slitting to the required width, cutting to the required length, and punching to the required shape. In some cases, cleavage occurred inside the film in the cut portion. Even after the films were incorporated into final products, there were cases of cleavage during use. Cleavage in the cut portion may occur at the time of cutting or may occur due to irritation in the subsequent process. In either case, the cleaved portion turned white or the peeled portion became foreign matter as fine powder, which damaged the quality of the product in some cases.

Specifically, an object of the present invention is to provide a polyethylene terephthalate-based resin film that has excellent processing suitability and that particularly can effectively suppress the occurrence of cleavage in the film layer of a portion cut with a knife. Another object is to provide a polarizer, a transparent conductive film, a touch panel, and image display devices such as a liquid crystal display device and an organic EL display device, all of which use the polyethylene terephthalate-based resin film.

Solution to Problem

The present inventors conducted extensive research and found that the above objects can be achieved by controlling the amorphous orientation parameter, as measured by an ATR-FTIR method, of a polyethylene terephthalate-based resin film having a specific range of retardation to be equal to or higher than a specific value. Thus, the present invention has been completed.

Representative aspects of the present invention are as described below.

Item 1.

A polyethylene terephthalate-based resin film satisfying the following (1) and (2):

(1) the polyethylene terephthalate-based resin film has a retardation of 3000 to 30000 nm; and (2) the polyethylene terephthalate-based resin film has an amorphous orientation parameter of 0.330 or more as measured by an ATR-FTIR method, the amorphous orientation parameter being represented by the following equation:

$$\text{(amorphous orientation parameter)} = R_{slow}/R_{fast}$$

wherein $R_{slow}$ is (absorbance at 1372 cm$^{-1}$ in slow axis direction)/(absorbance at 795 cm$^{-1}$ in slow axis direction), and is (absorbance at 1372 cm$^{-1}$ in fast axis direction)/ (absorbance at 795 cm$^{-1}$ in fast axis direction).

Item 2.

The polyethylene terephthalate-based resin film according to Item 1, further satisfying the following (3):

(3) the polyethylene terephthalate-based resin film has a breaking strength of 450 MPa or less in the slow axis direction.

Item 3.

The polyethylene terephthalate-based resin film according to Item 1 or 2, further satisfying the following (4):

(4) the polyethylene terephthalate-based resin film has a plane orientation coefficient AP of 0.135 or less.

Item 4.

The polyethylene terephthalate-based resin film according to any one of Items 1 to 3, further satisfying the following (5):

(5) the polyethylene terephthalate-based resin film has a rigid amorphous fraction of 33 mass % or more, the rigid amorphous fraction being represented by the following equation:

(rigid amorphous fraction(mass %))=100−(mobile amorphous fraction(mass %))−(mass fraction crystallinity(mass %))

Item 5.

A polarizer comprising a polarizing film and the polyethylene terephthalate-based resin film according to any one of Items 1 to 4 laminated as a protective film on at least one surface of the polarizing film.

Item 6.

An image display device comprising the polarizer according to Item 5.

Item 7.

A liquid crystal display device comprising a backlight light source, two polarizers, and a liquid crystal cell disposed between the two polarizers, at least one of the two polarizers being the polarizer according to Item 5.

Item 8.

An organic EL display device comprising the polarizer according to Item 5.

Item 9.

A transparent conductive film comprising the polyethylene terephthalate-based resin film according any one of Items 1 to 4 as a base film of the transparent conductive film.

Item 10.

A touch panel comprising the transparent conductive film according to Item 9.

Item 11.

An image display device comprising an image display panel and the polyethylene terephthalate-based resin film according any one of Items 1 to 4 as a scattering prevention film or a surface protection film on a viewing side of the image display panel.

Advantageous Effects of Invention

The present invention can provide a polyethylene terephthalate-based resin film that has excellent processing suitability and that particularly can effectively suppress the occurrence of cleavage in the film layer of a portion cut with a knife. The present invention can also provide a polarizer, a transparent conductive film, a touch panel, and image display devices such as a liquid crystal display device and an organic EL display device, all of which use the polyethylene terephthalate-based resin film.

DESCRIPTION OF EMBODIMENTS

1. Polyethylene Terephthalate-Based Resin Film

The polyethylene terephthalate-based resin film of the present invention preferably has a retardation of 3000 nm or more and 30000 nm or less. When the retardation is 3000 nm or more, the formation of interference color can be suppressed when observed from an oblique direction, and excellent visibility can be ensured. The lower limit of the retardation is preferably 4000 nm, and more preferably 5000 nm.

The upper limit of the retardation is preferably 30000 nm. Even if a polyethylene terephthalate-based resin film having a retardation of higher than 30000 nm is used, the effect of further improving visibility cannot be substantially attained, and the thickness of the film considerably increases, which reduces the handling of the film as an industrial material. The upper limit is preferably 10000 nm, more preferably 9000 nm, and even more preferably 8000 nm.

The refractive index difference (refractive index in slow axis direction—refractive index in fast axis direction) in the film plane is preferably 0.08 or more. When the film is strongly stretched in one direction, and the refractive index difference in the film plane is larger, sufficient retardation can be obtained even in a thinner film, which is preferable in terms of making the film thinner. The refractive index difference in the film plane is thus more preferably 0.09 or more, and even more preferably 0.10 or more. However, if the refractive index difference in the film plane is too large, the mechanical properties of the film become significantly anisotropic. This tends to cause the film to, for example, tear or break. The upper limit of the refractive index difference is preferably 0.15 or less, more preferably 0.145, even more preferably 0.14, still even more preferably 0.135, particularly preferably 0.13, and most preferably 0.125 or less.

The retardation of the present invention can be determined by measuring refractive indices in the two axis directions in the film plane and the thickness of the film, or can also be determined using a commercially available automatic birefringence analyzer, such as a KOBRA-21ADH (Oji Scientific Instruments). The refractive indices are measured at a measurement wavelength of 589 nm.

The polyethylene terephthalate-based resin film of the present invention preferably has an amorphous orientation parameter of 0.330 or more, which is an index of amorphous orientation to the slow axis direction in the film plane, from the viewpoint of reducing cutting resistance during cutting, and suppressing the occurrence of cleavage in the polyethylene terephthalate-based resin film layer of a portion cut with a knife. The amorphous orientation parameter of the present invention is preferably 0.330 or more, more preferably 0.332 or more, even more preferably 0.334 or more, and still even more preferably 0.335 or more. Because cutting resistance during cutting can be further reduced without overly increasing the orientation anisotropy of the polyethylene terephthalate-based resin film, it is preferable that not only the above lower limit is satisfied, but also the upper limit of the amorphous orientation parameter is 0.500 or less. The upper limit is more preferably 0.450 or less, even more preferably 0.400 or less, and still even more preferably less than 0.390. The upper limit is even more preferably 0.385 or less, and still even more preferably 0.380 or less.

The amorphous orientation parameter of the polyethylene terephthalate-based resin film is represented by the following equation (1):

$$(\text{Amorphous orientation parameter})=R_{slow}/R_{fast} \tag{1}$$

In the above equation (1), $R_{slow}$ is (absorbance at 1372 cm$^{-1}$ in slow axis direction)/(absorbance at 795 cm$^{-1}$ in slow axis direction), and $R_{fast}$ is (absorbance at 1372 cm$^{-1}$ in fast axis direction)/(absorbance at 795 cm$^{-1}$ in fast axis direction). The absorbance at 1372 cm$^{-1}$ and the absorbance at 795 cm$^{-1}$ are determined by attenuated total reflectance-Fourier transform infrared spectroscopy (ATR-FTIR) using a commercially available Fourier transform infrared spectrophotometer, such as FTS 60A/896 (Varian). In the infrared absorption spectrum of the polyethylene terephthalate-based resin film of the present invention, the absorbance at 1372 cm$^{-1}$ reflects, among the conformations of the methylene group, the gauche conformation mainly included in the amorphous region. In contrast, the absorbance at 795 cm$^{-1}$ reflects the out-of-plane vibration of the benzene ring. Since the absorbance does not change depending on the orientation of the film surface or the anvil pressure during ATR measurement, it can be used for normalization of absorbance at other wavenumbers. The absorbance at 1372 cm$^{-1}$ does not necessarily refer to absorbance at just 1372 cm$^{-1}$, but shows absorbance of the peak top observed at around 1372 cm$^{-1}$ (1367 cm$^{-1}$ to 1377 cm$^{-1}$). If no clear peak top is observed, the absorbance at 1372 cm$^{-1}$ can be read. Similarly, the absorbance at 795 cm$^{-1}$ does not necessarily refer to absorbance at just 795 cm$^{-1}$, but shows absorbance of the peak top observed at around 795 cm$^{-1}$ (790 cm$^{-1}$ to 800 cm$^{-1}$). If no clear peak top is observed, the absorbance at 795 cm$^{-1}$ can be read. The details of the measurement method are described later in the Examples.

In general, the processing suitability of polyethylene terephthalate-based resin films is affected by crystals growing in the orientation direction with stretching. In the polyethylene terephthalate-based resin film of the present invention, orientation anisotropy in the film plane is enhanced to suppress rainbow unevenness, and crystals grow preferentially in the slow axis direction, which corresponds to the main stretching direction. Crystal growth increases cutting resistance in the fast axis direction perpendicular to the slow axis direction, and embrittles the polyethylene terephthalate-based resin film. For this reason, in some polyethylene terephthalate-based resin films produced by known methods, cleavage occurred in the film layer at the edge of a side parallel to the fast axis direction of the film in a portion cut with a knife. As a result of various examinations, the present inventors found that by controlling the amorphous orientation parameter, which is an index of amorphous orientation to the slow axis direction in the film plane, within the above range, even when orientation anisotropy is increased, the increase in cutting resistance in the fast axis direction and the embrittlement of the polyethylene terephthalate-based resin film can be effectively suppressed, and the occurrence of cleavage in the polyethylene terephthalate-based resin film layer of a portion cut with a knife can also be effectively suppressed.

It is preferable for the polyethylene terephthalate-based resin film of the present invention not only to control the amorphous orientation parameter within the above specific range, but also to set the breaking strength in the slow axis direction in the film plane to 450 MPa or less, from the viewpoint of further reducing cutting resistance in the fast axis direction, and further suppressing the occurrence of cleavage in the polyethylene terephthalate-based resin film layer of a portion cut with a knife. The breaking strength of the polyethylene terephthalate-based resin film in the slow axis direction is preferably 450 MPa or less, more preferably 440 MPa or less, even more preferably 430 MPa or less, and still even more preferably 420 MPa or less. Although the lower limit is not particularly limited, from the viewpoint of maintaining orientation anisotropy sufficient for suppressing rainbow unevenness, the lower limit is preferably 220 MPa or more, more preferably 230 MPa, even more preferably 240 MPa, and still even more preferably 250 MPa. The polyethylene terephthalate-based resin film of the present invention preferably has a plane orientation coefficient LP of 0.135 or less, from the viewpoint of further suppressing the occurrence of cleavage in the polyethylene terephthalate-based resin film layer of a portion cut with a knife. The plane orientation coefficient AP of the polyethylene terephthalate-based resin film is preferably 0.135 or less, more preferably or less, and even more preferably 0.12 or less. The plane orientation coefficient is preferably 0.08 or more, and more preferably 0.10 or more. If the plane orientation coefficient is less than 0.08, the film thickness may vary, and retardation values may be uneven in the film plane.

The polyethylene terephthalate-based resin film of the present invention preferably has a rigid amorphous fraction of 33 mass % or more, from the viewpoint of further suppressing the embrittlement of the polyethylene terephthalate-based resin film, and further suppressing the occurrence of cleavage in the polyethylene terephthalate-based resin film layer of a portion cut with a knife. The polyethylene terephthalate-based resin film preferably has a rigid amorphous fraction of 33 mass % or more, more preferably 34 mass % or more, even more preferably 35 mass % or more, and still even more preferably 36 mass % or more. The upper limit is preferably 60 mass %; however, it is also sufficient that the upper limit is about 50 mass % or 45 mass %. The rigid amorphous fraction is expressed by the following equation (2).

$$\text{Rigid amorphous fraction(mass \%)}=100-(\text{mobile amorphous fraction(mass \%)})-(\text{mass fraction crystallinity(mass \%)}) \quad (2)$$

Conventionally, the higher-order structure of polymers has been considered to be divided into a crystalline region and an amorphous region. However, in recent year, it has been reported that the amorphous region can be further divided by the temperature dependence of the molecular motion and that the amorphous region can be divided into a mobile amorphous region in which the molecular motion is released at the glass transition point (Tg) and a rigid amorphous region in which the molecular motion is frozen even at a temperature that is equal to or higher than Tg. In the case of polyethylene terephthalate, the rigid amorphous region is known to remain amorphous up to a temperature near 200° C. In general, it is considered that the rigid amorphous is present in the boundary region between crystal and mobile amorphous, and that the rigid amorphous fraction increases with increasing crystallinity. As a result of research, the present inventors found that by controlling the rigid amorphous fraction within the above range, even when orientation anisotropy is increased in the film plane, the embrittlement of the polyethylene terephthalate-based resin film associated with crystallization can be more effectively suppressed, and the occurrence of cleavage in the polyethylene terephthalate-based resin film layer of a portion cut with a knife can be more easily suppressed.

In equation (2) above, the rigid amorphous fraction is determined indirectly by using the values of the mobile amorphous fraction and the mass fraction crystallinity. The mobile amorphous fraction is determined from the reversing heat capacity difference $\Delta Cp$ at Tg of a reversing heat capacity curve obtained by temperature-modulated DSC measurement using a differential scanning calorimeter (Q100 produced by TA Instruments). The mass fraction crystallinity is calculated from the density value obtained using a density gradient tube according to JIS K7112. The details are described later in the Examples.

The polyethylene terephthalate-based resin film of the present invention can be produced based on a general production method for polyester films. For example, non-oriented polyethylene terephthalate-based resin film obtained by melting a polyethylene terephthalate-based resin and extruding the molten resin into a sheet-like shape is stretched in a longitudinal direction through the use of roll velocity difference at a temperature higher than the glass transition temperature, and then stretched in a transverse direction with a tenter, followed by heat treatment.

The film-forming conditions of the polyethylene terephthalate-based resin film are described in detail below. As a result of research night and day, the present inventors found that by preheating the film at a sufficiently high temperature and then stretching the film at a temperature moderately lower than the preheating temperature, it is possible to promote the orientation of amorphous molecular chains during stretching and to effectively increase the amorphous orientation parameter. The stretch temperature is preferably at least 5° C. lower than the preheating temperature. The conditions of stretching in the longitudinal direction and stretching in the transverse direction are described in detail below. The preheating temperature is preferably 100 to 150° C., more preferably 105 to 140° C., and particularly preferably 110 to 130° C. If the preheating temperature is overly low, it is difficult to advance the orientation of amorphous molecular chains, and it tends to be difficult to sufficiently increase the amorphous orientation parameter. In contrast, if the preheating temperature is overly high, thickness unevenness tends to occur during stretching. Moreover, the stretch temperature is preferably 85 to 105° C., and particularly preferably 90 to 100° C. If the stretch temperature is overly high, stretching stress is insufficient, and thickness unevenness occurs; in addition, it tends to be difficult to sufficiently increase the amorphous orientation parameter. In contrast, if the stretch temperature is overly low, excessive growth of crystals tends to make it difficult to sufficiently increase the amorphous orientation parameter. The present inventors found that by controlling the stretch temperature within the above range, even if the preheating temperature is increased, it is possible to effectively increase the amorphous orientation parameter while suppressing thickness unevenness.

When a film that has a slow axis in the film width direction (TD direction) is produced, the stretch ratio for stretching in the longitudinal direction is preferably 0.7 to 1.5, and particularly preferably 0.7 to 1.0. The stretch ratio for stretching in the transverse direction is preferably 4.0 to 7.0. In order to suppress relaxation of amorphous molecular chains during stretching and increase the rigid amorphous fraction, the stretch ratio for stretching in the transverse direction is preferably high. The lower limit of the stretch ratio for stretching in the transverse direction is preferably 4.5, more preferably 4.7, and particularly preferably 5.0. However, if the stretch ratio for stretching in the transverse direction exceeds 7.0, the film tends to easily tear in the transverse direction, resulting in decreased productivity. Thus, the upper limit of the stretch ratio for stretching in the transverse direction is preferably 7.0, more preferably 6.5, particularly preferably 6.0, and most preferably 5.5. When a film that has a slow axis in the film longitudinal direction (MD direction) is produced, the stretch ratio for stretching in the transverse direction is preferably 1.0 to 3.0, and more preferably 2.0 to 3.0. The stretch ratio for stretching in the longitudinal direction is preferably 4.0 to 7.0. In order to suppress relaxation of amorphous molecular chains during stretching and increase the rigid amorphous fraction, the stretch ratio for stretching in the longitudinal direction is preferably high. The lower limit of the stretch ratio for stretching in the longitudinal direction is preferably 4.5, more preferably 4.7, and particularly preferably 5.0. However, if the stretch ratio for stretching in the longitudinal direction exceeds 7.0, the film easily tears in the longitudinal direction, resulting in decreased productivity. Thus, the upper limit of the stretch ratio for stretching in the longitudinal direction is preferably 7.0, more preferably 6.5, and particularly preferably 6.0. When the stretch ratio for stretching in the longitudinal direction and the stretch ratio for stretching in the transverse direction are within the above ranges, it is possible to effectively increase the rigid amorphous fraction. In contrast, as the stretch ratio in the slow axis direction increases, crystal growth tends to dominate, and it tends to be difficult to sufficiently increase the amorphous orientation parameter. Therefore, in order to promote the orientation of amorphous molecular chains during stretching and to control the amorphous orientation parameter within the above range, it is preferable to preheat the film at a sufficiently high temperature and then stretch the film at a temperature moderately lower than the preheating temperature, as described above.

In order to control the retardation within the above range, it is preferable to control the proportion of longitudinal stretch ratio and transverse stretch ratio, the stretch temperature, and the film thickness. If the difference between the longitudinal and transverse stretch ratios is overly small, it tends to be difficult to increase the retardation.

In order to effectively suppress the embrittlement of the polyethylene terephthalate-based resin film associated with crystallization during heat treatment, it is preferable to increase the rigid amorphous fraction. Specifically, it is preferable to suppress relaxation of amorphous molecular chains during stretching, and it is preferable to increase the strain rate during stretching of the film in the slow axis direction. The strain rate is preferably 13%/sec or more, more preferably 15%/sec or more, and particularly preferably 170/sec or more. The upper limit is preferably 60%/sec, in terms of film-forming properties. The strain rate is a parameter that is expressed as (nominal strain (%) in stretching in the slow axis direction)/(time required in stretching in the slow axis direction (sec)). The nominal strain (%) is determined according to ((deformation amount (mm))/(initial length (mm)))×100.

In the subsequent heat treatment, from the viewpoint of promoting oriented crystallization and increasing retardation, it is necessary to perform the treatment at a high temperature sufficient to promote oriented crystallization. On the other hand, as a result of extensive research, the present inventors found that by performing the heat treatment in two separate stages, i.e., high-temperature treatment followed by low-temperature treatment, it is possible to suppress excessive growth of crystals and prevent the decrease in the amorphous orientation parameter, and it is also possible to effectively suppress the increase in cutting resistance and film embrittlement. The heat treatment temperature during high-temperature treatment is preferably at least 5° C. higher than the heat treatment temperature during low-temperature treatment. The lower limit of the heat treatment temperature during high-temperature treatment is preferably 150° C., more preferably 160° C., particularly preferably 170° C., and most preferably 180° C. In contrast, from the viewpoint of suppressing excessive crystal growth and preventing the decrease in the amorphous orientation parameter, the upper limit of the heat treatment temperature during high-temperature treatment is preferably 220° C., more preferably 210° C., and particularly preferably 200° C. Moreover, the lower limit of the heat treatment temperature during low-temperature treatment is preferably 100° C., more preferably 110° C., particularly preferably 120° C., and most preferably 130° C. In contrast, from the viewpoint of suppressing excessive crystal growth and preventing the decrease in the amorphous orientation parameter, the upper limit of the heat treatment temperature during low-temperature treatment is preferably 170° C., more preferably 160° C., and particularly preferably 150° C.

The present inventors found that by preheating the film at a sufficiently high temperature and then stretching the film at a temperature lower than the preheating temperature, together with by performing heat treatment in two separate stages, i.e., high-temperature treatment followed by low-temperature treatment, it is possible to effectively increase the amorphous orientation parameter, and it is effective to suppress cleavage in the polyethylene terephthalate-based resin film layer of a portion cut with a knife. Thus, the present invention has been completed.

In the polyethylene terephthalate-based resin that forms the polyethylene terephthalate-based resin film, it is preferable that 85 mol % or more of the monomer units are ethylene terephthalate. The proportion of ethylene terephthalate units is preferably 90 mol % or more, and more preferably 95 mol % or more. Known acid components and glycol components may also be used as copolymerization components. The polyethylene terephthalate-based resin is particularly preferably polyethylene terephthalate, which is a homopolymer.

These resins have excellent transparency and also have excellent thermal and mechanical properties. This makes it possible to easily control the retardation by stretching. Polyethylene terephthalate is the most suitable material because it has high intrinsic birefringence, and therefore can relatively easily provide great retardation even if the thickness of the film is small.

Moreover, in order to prevent degradation of the optical functional dye, such as iodine dye, the polyethylene terephthalate-based resin film of the present invention may have a light transmittance at a wavelength of 380 nm of 20% or less. The light transmittance at 380 nm is more preferably 15% or less, even more preferably 10% or less, and particularly preferably 5% or less. When the above light transmittance is 20% or less, the degradation of the optical functional dye caused by ultraviolet light can be suppressed. In addition, the transmittance in the present invention is measured vertically with respect to the plane of the film, and can be measured with a spectrophotometer (e.g., Hitachi U-3500 spectrophotometer).

In order to adjust the transmittance of the polyethylene terephthalate-based resin film of the present invention at a wavelength of 380 nm to 20% or less, it is preferable to suitably control the type and concentration of an ultraviolet absorber and the thickness of the film. The ultraviolet absorber used in the present invention is a known substance. Examples of the ultraviolet absorber include organic ultraviolet absorbers and inorganic ultraviolet absorbers; however, organic ultraviolet absorbers are preferred in terms of transparency. Specific examples of organic ultraviolet absorbers include benzotriazole-based ultraviolet absorbers, benzophenone-based ultraviolet absorbers, cyclic imino ester-based ultraviolet absorbers, and a combination thereof; however, the organic ultraviolet absorbers are not particularly limited as long as they have an absorbance within the range described above. Benzotriazole-based ultraviolet absorbers and cyclic imino ester-based ultraviolet absorbers are particularly preferred in terms of durability. When two or more ultraviolet absorbers are used in combination, ultraviolet lights of different wavelengths can be absorbed at the same time. Thus, the ultraviolet absorption effect can be further improved.

Examples of benzophenone-based ultraviolet absorbers, benzotriazole-based ultraviolet absorbers, and acrylonitrile-based ultraviolet absorbers include 2-[2'-hydroxy-5'-(meth-acryloyloxymethyl)phenyl]-2H-benzotriazole, 2-[2'-hy-droxy-5'-(methacryloyloxymethyl)phenyl]-2H-benzot-riazole, 2-[2'-hydroxy-5'-(methacryloyloxymethyl)phenyl]-2H-benzotriazole, 2,2'-dihydroxy-4,4'-dimethoxy- benzo-phenone, 2,2',4,4'-tetrahydroxybenzophenone, 2,4-di-tert-butyl-6-(5-chlorobenzotriazol-2-yl)phenol, 2-(2'-hydroxy-3'-tert-butyl-5'-methylphenyl)-5-chlorobenzotriazole, 2-(5-chloro(2H)-benzotriazol-2-yl)-4-methyl-6-(tert-butyl) phenol, 2,2'-methylenebis(4-(1,1,3,3-tetramethylbutyl)-6-(2H-benzotriazol-2-yl)phenol), and the like. Examples of cyclic imino ester-based ultraviolet absorbers include 2,2'-(1,4-phenylene)bis(4H-3,1-benzoxazin-4-one), 2-methyl-3,1-benzoxazin-4-one, 2-butyl-3,1-benzoxazin-4-one, 2-phe-nyl-3,1-benzoxazin-4-one, and the like. However, ultraviolet absorbers are not limited to these examples.

In another preferred embodiment, in addition to the ultraviolet absorber, various additives other than catalysts are added in the range in which the effect of the present invention is not impaired. Examples of such additives include inorganic particles, heat-resistant polymer particles, alkali metal compounds, alkaline earth metal compounds, phosphorus compounds, antistatic agents, light-resistant agents, flame retardants, heat stabilizers, antioxidants, anti-gelling agents, surfactants, and the like. Moreover, in order to achieve high transparency, it is also preferable that the polyethylene terephthalate-based resin film does not substantially contain particles. "Not substantially contain particles" means that, for example, in the case of inorganic particles, the content of inorganic elements quantified by X-ray fluorescence analysis is 50 ppm or less, preferably 10 ppm or less, and particularly preferably not greater than the detection limit.

Moreover, as the method of mixing an ultraviolet absorber with the polyethylene terephthalate-based resin film of the present invention, known methods can be used in combination. For example, a masterbatch is produced beforehand by mixing a dried ultraviolet absorber with polymer raw materials using a kneading extruder, and the masterbatch and the polymer raw materials are mixed during the film production.

In that case, the ultraviolet absorber concentration in the masterbatch is preferably 5 to 30 mass % so as to uniformly disperse and economically mix the ultraviolet absorber. Preferred conditions for producing the masterbatch include use of a kneading extruder, and extrusion at a temperature equal to or greater than the melting point of the polyethylene terephthalate-based raw material and equal to or lower than 290° C. for 1 to 15 minutes. At a temperature of 290° C. or more, a large amount of ultraviolet absorber is lost, and the viscosity of the masterbatch is significantly reduced. For an extrusion time of 1 minute or less, it tends to be difficult to homogeneously mix the ultraviolet absorber. At this point, a stabilizer, a color tone-controlling agent, and an antistatic agent may be added, if necessary.

Furthermore, in the present invention, the film may have a multi-layered structure including at least three or more layers, and an ultraviolet absorber may be added to the intermediate layer(s) of the film. Such a three-layer film containing an ultraviolet absorber in the intermediate layer can be specifically produced in the following manner. Polyethylene terephthalate-based resin pellets are singly used for the outer layers. For the intermediate layer, polyethylene terephthalate-based resin pellets and a masterbatch containing an ultraviolet absorber are mixed in a predetermined proportion, and then dried. These are supplied into a known extruder for melt-lamination, and extruded through a slit-shaped die into a sheet-like shape, followed by cooling and solidification on a casting roll, thereby forming an unstretched film. More specifically, film layers constituting both outer layers and a film layer constituting the intermediate layer are laminated by using two or more extruders, a three-layer manifold, or a junction block (e.g., a junction block with a square-shaped junction). A three-layered sheet is extruded through a die and cooled on a casting roll, thereby forming an unstretched film. In order to remove foreign substances, which cause optical defects, from the raw material (i.e., polyethylene terephthalate-based resin), it is preferable to perform high-precision filtration during melt extrusion. The filtration particle size (initial filtration efficiency: 95%) of a filtering medium used for high-precision filtration of the molten resin is preferably 15 μm or less. When the filtration particle size of the filtering medium is more than 15 μm, removal of foreign substances with a size of 20 μm or more is likely to be insufficient.

Furthermore, in order to enhance the adhesion of the surface of the polyethylene terephthalate-based resin film of the present invention, the polyethylene terephthalate-based resin film can be subjected to corona treatment, coating treatment, flame treatment, or the like.

In the present invention, in order to enhance the adhesion of the polyethylene terephthalate-based resin film surface, the film of the present invention preferably has, on at least one of its sides, an adhesion-facilitating layer (adhesion-modified coating layer). As the adhesion-facilitating layer, conventionally known ones can be appropriately used; however, preferred is one comprising at least one of polyester resin, polyurethane resin, and polyacrylic resin as a main component. "Main component" as used herein refers to, among solid components that constitute the adhesion-facilitating layer, one with 50 mass; or more. The coating solution used to form the adhesion-facilitating layer is preferably an aqueous coating solution comprising at least one of water-soluble or water-dispersible copolymerized polyester resin, acrylic resin, and polyurethane resin. Examples of such coating solutions include a water-soluble or water-dispersible copolymerized polyester resin solution, acrylic resin solution, polyurethane resin solution, etc., as disclosed in JP3567927B, JP3589232B, JP3589233B, JP3900191B, JP4150982B, etc.

The adhesion-facilitating layer can be obtained, for example, by applying the coating solution to one side or both sides of an unstretched film or a longitudinally uniaxially stretched film, followed by drying at 100 to 150° C., and further stretching the film in a transverse direction. The final amount of coating of the adhesion-facilitating layer is preferably maintained in the range of 0.05 to 0.20 g/m². When the amount of coating is less than 0.05 g/m², the adhesion may be insufficient. In contrast, when the amount of coating exceeds 0.20 g/m², blocking resistance may be reduced. Moreover, the thickness of the final adhesion-facilitating layer obtained after stretching is preferably 1 μm or less, more preferably 0.5 μm or less, and even more preferably 0.2 μm or less, in terms of obtaining excellent coating appearance. When the adhesion-facilitating layer is provided on both sides of the polyethylene terephthalate-based resin film, the amounts of coating of the adhesion-facilitating layers on both sides may be the same or different, and can be independently set within the above range.

It is preferable to add particles to the adhesion-facilitating layer so as to impart lubricating properties. Fine particles with an average particle diameter of 2 μm or less are preferably used. Particles with an average particle diameter of more than 2 μm tend to easily drop out from the coating layer. Examples of the particles to be added to the adhesion-facilitating layer include inorganic particles of titanium oxide, barium sulfate, calcium carbonate, calcium sulfate, silica, alumina, talc, kaolin, clay, calcium phosphate, mica, hectorite, zirconia, tungsten oxide, lithium fluoride, calcium fluoride, or the like; and styrene, acrylic, melamine, benzoguanamine, silicone, and other organic polymer particles. These particles may be added singly or in a combination of two or more to the adhesion-facilitating layer.

Moreover, the method for applying the coating solution may be a known method. Examples include reverse-roll coating, gravure coating, kiss coating, roll-brush coating, spray coating, air-knife coating, wire-bar coating, pipe doctor methods, and the like. These methods can be used singly or in combination.

The average particle diameter of the above particles is measured in the following manner. Images of the particles are taken with a scanning electron microscope (SEM). The maximum, diameter of 300 to 500 individual particles (distance between the two most separated points) is measured at such a magnification that the size of the smallest single particle is 2 to 5 mm. The average of the maximum diameter of the particles is regarded as the average particle diameter.

In another preferred embodiment, functional layers, such as a hard coating layer, anti-reflection layer, low reflection layer, anti-glare layer, light diffusion layer, lens layer, and prismatic layer, are laminated on at least one surface of the polyethylene terephthalate-based resin film of the present invention through the adhesion-facilitating layer.

Such a functional layer is generally formed using an active energy beam-curable resin composition; however, residual strain occurs between the functional layer and the polyethylene terephthalate-based resin film layer due to shrinkage during curing of the active energy beam-curable resin composition. When a cut is made with a knife, residual strain is released at the edge, resulting in rapid deformation. As a result, cleavage may be more likely to occur in the polyethylene terephthalate-based resin film layer.

Further, the polyethylene terephthalate-based resin film of the present invention is often laminated with other materials using an adhesive; however, residual strain due to curing of the adhesive in the case of laminate, or strain due to the difference in expansion coefficient of other materials due to heat or humidity may also cause cleavage in the same manner as above. In particular, when the adhesive is made of an active energy beam-curable resin composition, cleavage tends to easily occur in the polyethylene terephthalate-based resin film layer.

Regarding cleavage in the polyethylene terephthalate-based resin film layer, for example, even if the polyethylene terephthalate-based resin film layer is not necessarily completely cut, as in a hard coat adhesion test by a cross-cut method, cleavage may occur starting from the partially cut section. According to the present invention, even when functional layers using an active energy beam-curable resin composition mentioned above are laminated on the film, or the film is laminated with other materials, the increase in cutting resistance in the fast axis direction and the embrittlement of the polyethylene terephthalate-based resin film can be effectively suppressed, and the occurrence of cleavage in the polyethylene terephthalate-based resin film layer of a portion cut with a knife can be effectively suppressed.

The polyethylene terephthalate-based resin film of the present invention may have any thickness and preferably has a thickness in the range of 30 to 300 μm, and more preferably 40 to 200 μm. Even a film with a thickness of lower than 30 μm can, in principle, provide a retardation of 3000 nm or more. In this case, however, the mechanical properties of the film become significantly anisotropic. This tends to cause the film to, for example, tear or break. The lower limit of the thickness is particularly preferably 45 μm.

When the polyethylene terephthalate-based resin film of the present invention is used as a protective film, the upper limit of the thickness of the polyethylene terephthalate-based resin film is preferably 300 μm or less so that the polarizer is not too thick. The upper limit of the thickness of the polyethylene terephthalate-based resin film is preferably 120 μm or less, more preferably 100 μm or less, even more preferably 80 μm or less, still even more preferably 75 μm, or less, further more preferably 70 μm, or less, further even more preferably 65 μm or less, further still even more preferably 60 μm or less, and further still even more preferably 55 μm or less, in terms of practicality as a protective film. The lower limit of the thickness of the polyethylene terephthalate-based resin film is preferably 30 lam or more, more preferably 40 μm or more, and even more preferably 45 μm or more. In general, the thickness of the protective film is preferably in the range of 30 to 65 μm from the viewpoint of making the film thinner.

In recent years, there is a strong demand for even thinner protective films, and the processing suitability of protective films tends to decrease more and more. Even in such a case, according to the present invention, the increase in cutting resistance in the fast axis direction and the embrittlement of the polyethylene terephthalate-based resin film can be effectively suppressed, and the occurrence of cleavage in the polyethylene terephthalate-based resin film layer of a portion cut with a knife can be effectively suppressed.

In order to suppress variation of the retardation, the thickness variation of the film is preferably low. Since the stretch temperature and the stretch ratios have a great effect on the film thickness variation, it is preferable to optimize the film-forming conditions in terms of the thickness variation. In particular, when the longitudinal stretch ratio is reduced to increase retardation, the longitudinal thickness variation may deteriorate. Since there is an area in which the longitudinal thickness variation significantly deteriorates in a specific range of the stretch ratio, it is preferable to determine the film-forming conditions outside that range.

The film of the present invention preferably has a thickness variation of 5.0% or less, more preferably 4.5% or less, even more preferably 4.0% or less, and particularly preferably 3.0% or less.

In the polyethylene terephthalate-based resin film of the present invention, the Nz factor expressed as $|nt-nz|/|ny-nx|$ is preferably 1.7 or less. The Nz factor can be determined in the following manner. The orientation axis direction of the film is determined with a molecular orientation analyzer (MOA-6004, produced by Oji Scientific Instruments), and the refractive indices (ny and nx; ny>nx) in two directions; i.e., the orientation axis direction and a direction orthogonal to the orientation axis direction, and the refractive index (nz) in the thickness direction, are determined with an Abbe refractometer (NAR-4T produced by Atago Co., Ltd.; measurement wavelength: 589 nm). The Nz factor can be determined by substituting nx, ny, and nz obtained in this manner into the equation represented by $|ny-nz|/|ny-nx|$. The Nz factor is more preferably 1.65 or less, and even more preferably 1.63 or less. The lower limit of the Nz factor is preferably 1.2. In order to maintain the mechanical strength of the film, the lower limit of the Nz factor is preferably 1.3 or more, more preferably 1.4 or more, and even more preferably 1.45 or more.

The polyethylene terephthalate-based resin film preferably has a ratio (Re/Rth) of retardation (Re) to thickness-direction retardation (Rth) of 0.2 or more, more preferably 0.5 or more, and even more preferably 0.6 or more. It is preferable that the ratio (Re/Rth) is greater. The upper limit is preferably 2.0 or less, and more preferably 1.8 or less. The thickness-direction retardation is a parameter indicating the average of retardation obtained by multiplying two birefringence values $\Delta Nxz$ ($=|nx-nz|$) and $\Delta Nyz$ ($=|ny-nz|$) when viewed from a film-thickness direction cross-section by a film thickness d. The thickness-direction retardation (Rth) can be determined by determining refractive indices nx, ny, and nz, and the film thickness d (nm), and calculating the average value of ($\Delta Nxz \times d$) and ($GNyz \times d$). Refractive indices nx, ny, and nz are determined with an Abbe refractometer (NAR-4T produced by Atago Co., Ltd.; measurement wavelength: 589 nm).

2. Polarizer

The polyethylene terephthalate-based resin film of the present invention can be used as a protective film. The polarizer of the present invention has a structure in which a protective film comprising the polyethylene terephthalate-based resin film of the present invention is laminated on at least one surface of a polarizing film. The polarizing film can be prepared, for example, by dyeing polyvinyl alcohol (PVA) etc. with iodine.

For the surface of the polarizing film opposite to the surface on which the polyethylene terephthalate-based resin film is laminated (referred to as "the other surface"), it is preferable to use a birefringence-free film, typified by TAC films, acrylic films, and norbornene films. In another preferred embodiment, a protective film, an optical compensation film, etc. are not laminated on the other surface. Moreover, a coating layer, such as a hard coating layer, may be laminated on the other surface of the polarizing film. In another preferred embodiment, the surface of the polarizer used in the present invention is coated with various hard coatings so as to prevent background reflections, glare, scratches, and so on.

3. Image Display Device

The polarizer of the present invention can be used as a component of image display devices such as a liquid crystal display device and an organic EL display device, as described later.

4. Liquid Crystal Display Device

In general, a liquid crystal panel comprises a back module, a liquid crystal cell, and a front module in this order, starting from the side opposing a backlight light source to the side on which an image is displayed (i.e., the viewing side). The back module and the front module each ordinarily include a transparent substrate, a transparent conductive film formed on the surface of the transparent substrate on the liquid crystal cell side, and a polarizer disposed on the opposite side. In this regard, the polarizer in the back module is disposed on the side opposing the backlight light source, and the polarizer in the front module is disposed on the side on which an image is displayed (i.e., the viewing side).

The liquid crystal display device of the present invention comprises, as components, at least a backlight light source, two polarizers, and a liquid crystal cell disposed between the two polarizers. Furthermore, the liquid crystal display device may appropriately comprise, in addition to the above components, other components, such as a color filter, a lens film, an optical diffusion sheet, and an antireflection film. At least one of the two polarizers is preferably the polarizer of the present invention.

The structure of the backlight may be an edge-light system comprising a light guide plate, a reflector, etc., as components, or a direct under-light system.

Although the backlight light source in the liquid crystal display device of the present invention is not particularly limited, a white light source with one or more peak tops in an emission spectrum in each of the wavelength regions of 400 nm or more and less than 495 nm, 495 nm or more and less than 600 nm, and 600 nm or more and 780 nm or less can also be preferably used. Examples of such light sources include white light sources using quantum dot technology, phosphor-based white LED light sources that use phosphors with emission peaks in the R (red) and G (green) regions due to excitation light and blue LEDs, three-wavelength white LED light sources, white LED light sources combined with a red laser, white-light-emitting diodes comprising blue-light-emitting diodes and at least a fluoride phosphor that is $K_2SiF_6:Mn^{4+}$ (also called "KSF") as a phosphor, and the like.

Phosphor-based white LEDs obtained by combining light-emitting diodes using compound semiconductors to emit blue light or ultraviolet light with phosphors (e.g., yttrium-aluminum-garnet yellow phosphors or terbium-aluminum-garnet yellow phosphors), which are conventionally used, can also be preferably used.

The position of the protective film comprising the polyethylene terephthalate-based resin film of the present invention in the liquid crystal display device is not particularly limited. In the case of a liquid crystal display device comprising a polarizer disposed on the light-incoming side (light source side), a liquid crystal cell, and a polarizer on the light-outgoing side (viewing side), it is preferable that the protective film on the light-incoming side of the polarizing film of the polarizer disposed on the light-incoming side, and/or the protective film on the light-outgoing side of the polarizing film of the polarizer disposed on the light-outgoing side is a protective film comprising the polyethylene terephthalate-based resin film of the present invention. In a particularly preferred embodiment, the protective film on the light-outgoing side of the polarizing film of the polarizer disposed on the light-outgoing side is the polyethylene terephthalate-based resin film of the present invention. If a protective film comprising the polyethylene terephthalate-based resin film is disposed in a position other than the positions described above, the polarization properties of the liquid crystal cell may be changed. Since it is not preferable to use a protective film comprising the polyethylene terephthalate-based resin film of the present invention in a place for which polarization properties are required, the polymer film of the present invention is preferably used as the protective film of the polarizer in such a specific position.

The screen size of the liquid crystal display device of the present invention is not particularly limited and is preferably 32 inches or more.

5. Organic EL Display Device

A circular polarizer is preferably placed on the viewing side of the organic EL display device. When external light is reflected by the metal electrodes of the organic EL cell and emitted to the viewing side, the display surface of the organic EL display device may look like a mirror surface when viewed from the outside. In order to shield such specular reflection of external light, a circular polarizer is preferably placed on the viewing side of the organic EL cell. For example, a product obtained by laminating a quarter-wavelength plate (quarter-wavelength layer) on the polarizer of the present invention can be used as the circular polarizer for the organic EL display device.

6. Transparent Conductive Film and Touch panel

A touch panel generally has one or two or more transparent conductive films. The transparent conductive film has a structure in which a transparent conductive layer is laminated on a base film. The polyethylene terephthalate-based resin film of the present invention can be used as the base film. The type and method of touch panel are not particularly limited, and examples include resistive touch panels and capacitive touch panels.

The transparent conductive layer may be directly laminated on the base film, but may also be laminated through an adhesion-facilitating layer and/or various other layers. Examples of other layers include a hard coating layer, an index matching (IM) layer, a low-refractive index layer, and the like. The IM layer itself is, for example, a laminated structure of a high-refractive index layer and a low-refractive index layer (low refractive index layer on the transparent conductive thin film side). Use of this film makes it possible to make the ITO pattern difficult to see when looking at the liquid crystal display screen.

The transparent conductive layer on the base film can be formed of a conductive metal oxide. The conductive metal oxide that constitutes the transparent conductive layer is not particularly limited, and a conductive metal oxide of at least one metal selected from the group consisting of indium, tin, zinc, gallium, antimony, titanium, silicon, zirconium, magnesium, aluminum, gold, silver, copper, palladium, and tungsten is used. The metal oxide may further contain, if necessary, metal atoms shown in the above group. Preferred examples of the transparent conductive layer include a tin-doped indium oxide (ITO) layer and an antimony-doped tin oxide (ATO) layer, and preferably an ITO layer. Alternatively, the transparent conductive layer may be an Ag nanowire, Ag ink, a self-assembled conductive film of Ag ink, a mesh electrode, CNT ink, or a conductive polymer.

The thickness of the transparent conductive layer is not particularly limited. The transparent conductive layer can be formed according to known procedures. Examples include a vacuum vapor deposition method, a sputtering method, and an ion plating method.

In the transparent conductive film of the present invention, the transparent conductive layer in the plane may be partially removed and patterned. The transparent conductive film with a patterned transparent conductive layer has a pattern-forming part with the transparent conductive layer on the base film, and a pattern opening part without the transparent conductive layer on the base film. Examples of the shape of the pattern-forming part include a striped shape, a square shape, and the like.

7. Scattering Prevention Film and Surface Protection Film

The polyethylene terephthalate-based resin film of the present invention can be used as a scattering prevention film or a surface protection film, which is laminated on the viewing side of the image display panel.

EXAMPLES

The present invention is described below in more detail with reference to Examples; however, the present invention is not limited to these Examples. The present invention can be put into practice after appropriate modifications or variations within a range meeting the gist of the present invention, all of which are included in the technical scope of the present invention. In the following Examples, the methods for the evaluation of physical properties are as follows.

(1) Retardation (Re)

Retardation is a parameter defined by the product ($\Delta Nxy \times$ d) of the anisotropy ($\Delta Nxy = |nx-ny|$) of the refractive indices in two mutually orthogonal directions on a film and the film thickness d (nm), and is a scale indicating optical isotropy or anisotropy. The anisotropy ($\Delta Nxy$) of refractive indices in two directions is obtained by the following method. The slow axis direction of a film was determined with a molecular orientation analyzer (MOA-6004 produced by Oji Scientific Instruments), and the film was cut into a 4 cm×2 cm, rectangular sample so that the slow axis direction was parallel to the long side of the sample for measurement. The sample was measured for the refractive indices in two mutually orthogonal directions (refractive index in the slow axis direction: ny; refractive index in a direction orthogonal to the slow axis direction: nx) and the refractive index (nz) in the thickness direction by using an Abbe refractometer (NAR-4T produced by Atago Co., Ltd.; measurement wavelength: 589 nm). Then, the absolute value ($|nx-ny|$) of the difference between the refractive indices in the two directions was defined as the anisotropy ($\Delta Nxy$) of the refractive indices. The film thickness d (nm) was measured using an electric micrometer (Millitron 1245D produced by Feinpruf GmbH), and was converted into nm units. Retardation (Re) was determined by the product ($\Delta Nxy \times d$) of the anisotropy ($\Delta Nxy$) of the refractive indices and the film thickness d (nm).

(2) Amorphous Orientation Parameter

The amorphous orientation parameter of the polyethylene terephthalate-based resin film is represented by the above equation (1), and is calculated from the values of absorbance $A_{1372\text{-}slow}$ at 1372 cm$^{-1}$ in the slow axis direction, absorbance $A_{795\text{-}slow}$ at 795 cm$^{-1}$ in the slow axis direction, absorbance $A_{1372\text{-}fast}$ at 1372 cm$^{-1}$ in the fast axis direction, and absorbance $A_{795\text{-}fast}$ at 795 cm$^{-1}$ in the fast axis direction, obtained by attenuated total reflectance-Fourier transform infrared spectroscopy (ATR-FTIR) using a Fourier transform infrared spectrophotometer (FTS 60A/896 produced by Varian). The ATR-FTIR measurements were performed with a polarizing film inserted in an optical system, using a diamond crystal as an ATR prism, at an incident angle of 45 degrees. At this time, the slow axis of the film was arranged in parallel to the transmission axis of the polarizing film inserted in the optical system, and infrared absorption spectrum $A_{slow}$ ($\nu$) at each wavenumber $\nu$ (cm$^{-1}$) in the slow axis direction was obtained. Further, the fast axis of the film was arranged in parallel to the transmission axis of the polarizing film inserted in the optical system, and infrared absorption spectrum $A_{fast}$ ($\nu$) at each wavenumber $\nu$ (cm$^{-1}$) in the fast axis direction was obtained. The measurements were performed while the number of integrations was 64 for both sample and background, the wavenumber resolution was 2 cm$^{-1}$, and the measurement wavenumber range was 650 to 4000 cm$^{-1}$. As for the infrared absorption spectra obtained by the ATR-FTIR measurements, the penetration depth into the sample varied with wavenumber, and the baseline was curved. Thus, the obtained infrared absorption spectra were baseline-corrected by multiplying the absorbance at each wavenumber $\nu$ (cm$^{-1}$) by the ratio $\nu_{MAX}/\nu$ of the maximum wavenumber vex (cm$^{-1}$) within the measurement range to each wavenumber $\nu$ (cm$^{-1}$). In each of the baseline-corrected infrared absorption spectra, absorbance at 1371.385 cm$^{-1}$ was used as $A_{1372\text{-}slow}$ or $A_{1372\text{-}fast}$ and absorbance at 792.7415 cm$^{-1}$ was used as $A_{795\text{-}slow}$ or $A_{795\text{-}fast}$. "Absorbance" refers to the absolute value of absorption intensity at this wavenumber in the baseline-corrected infrared absorption spectrum. In the above measurements, the slow axis direction of the film was determined with a molecular orientation analyzer (MOA-6004, produced by Oji Scientific Instruments). The direction in the film plane orthogonal to the slow axis direction was defined as the fast axis direction.

(3) Breaking Strength in Slow Axis Direction

The breaking strength in the slow axis direction was evaluated by a tensile test according to item 7.2 of JIS C2318. A test piece was cut into a rectangular shape of 180 mm×10 mm with the slow axis direction obtained in the measurement of retardation (Re) as the long side. Marked lines with a length of mm parallel to the short sides were drawn at positions 40 mm inward from both short sides of the test piece. The thickness (mm) of the test piece was measured at 5 points in a section of 100 mm in length sandwiched between the marked lines, the average value was obtained, and the cross-sectional area (mm$^2$) of the test piece was calculated by multiplying the average value by the width (10 mm) of the test piece. The film thickness was measured using an electric micrometer (Millitron 1245D produced by Feinpruf GmbH). The tensile test was performed by gripping areas from the marked lines to the short sides with chucks so that the long side direction of the test piece was the tensile direction. A precision universal testing machine (Autograph AGX-V produced by Shimadzu Corporation) was used for the tensile test, the distance between the chucks was 100 mm, and the tensile speed was 100 mm/min. The breaking strength (MPa) in the slow axis direction was obtained by dividing the load at break (N) by the cross-sectional area (mm$^2$) of the test piece.

(4) Plane Orientation Coefficient ($\Delta P$)

A value obtained from (nx+ny)/2-nz using the refractive index value obtained in the measurement of retardation (Re) was defined as the plane orientation coefficient ($\Delta P$).

(5) Rigid Amorphous Fraction

The rigid amorphous fraction is expressed by equation (2) described above and is calculated indirectly from the values of the mobile amorphous fraction and the mass fraction crystallinity.

The mobile amorphous fraction is a parameter defined as (($\Delta Cp$ in a sample)/($\Delta Cp$ in a fully amorphous state))×100 (mass %) from the reversing heat capacity difference $\Delta Cp$ (J/(g·K)) at Tg of a reversing heat capacity curve obtained by temperature-modulated DSC measurement using a differential scanning calorimeter (Q100 produced by TA Instruments). In the case of polyethylene terephthalate, $\Delta Cp$ in a fully amorphous state=(J/(g·K)). 2.0±0.2 mg of a sample was weighed into an aluminum pan and measured under the conditions of the MDSC (registered trademark) modulated heat-only mode, an average temperature ramp rate of 5.0° C./min, and a modulation period of 60 sec. The measurement data were collected at a sampling frequency of 5 Hz. Indium was used for calibration of the temperature and heat quantity, and sapphire was used for calibration of the specific heat.

The calculation method for Tg and $\Delta Cp$ is described below. First, the first derivative F'(T) of temperature T of a reversing heat capacity curve F(T) was plotted and smoothed by taking the moving average of every 2401 points, and Tg was determined by reading the value of the temperature at the peak top. Next, a straight line G(T) passing through two points A (Tg-F(Tg-15)) and B (Tg+15, F(Tg+15)) was determined. Subsequently, the temperature at which F(T)−G(T) became minimal in the range of Tg−15<T<Tg+15 was defined as T1, and the temperature at which F(T)−G(T) became maximum in the range of Tg−+15≤T≤Tg+15 was defined as T2. Since T1 corresponds to the glass transition onset temperature, and T2 corresponds to the glass transition end temperature, the value of ΔCp was obtained by ΔCp=F(T2)−F(T1).

The mass fraction crystallinity x was calculated according to the following equation using the density value d (g/cm³) obtained by using a water/calcium nitrate density gradient tube according to JIS K7112.

$$x=(dc/d)\times((d-da)/(d-dc))\times100(\text{mass \%})$$

dc: the density of a fully crystalline state, da: the density of a fully amorphous state
In the case of polyethylene terephthalate, dc=1.498 (g/cm'), and da=1.335 (g/cm 3).

(6) Cross-Cut Evaluation

Using a Meyer bar, a hard coat coating solution (U-1 below) was applied to one side of a polyethylene terephthalate-based resin film prepared by a method described later so that the film thickness after drying was 4 μm. After drying at 80° C. for 1 minute, ultraviolet light was irradiated (accumulated light intensity: 200 mJ/cm²) to obtain a hard coating layer-laminated film. After the hard coating layer was aged for 24 hours at room temperature, a 100-square cross-cut evaluation was performed according to the cross-cut test of JIS K5400. Cross-cut evaluation is generally performed for the purpose of evaluating adhesion between the hard coating etc. and the base film. Here, the number of squares in which cleavage of the base film occurred when the tape was peeled off was counted, and the counted number was used as an index of resistance to cleavage in the polyethylene terephthalate-based resin film layer in the hard coat adhesion test.

Specifically, a cutter guide with a gap interval of 2 mm was used to make 100 square-shaped cuts, penetrating the hard coating layer to reach the film, on the hard coating layer surface. Next, cellophane adhesive tape (No. 405 produced by Nichiban Co., Ltd.; 24 mm wide) was applied to the square cut surface and rubbed with an eraser to ensure complete adhesion. After that, the cellophane adhesive tape was pulled off vertically from the hard coating layer surface of the hard coating layer-laminated film, and the number of squares peeled off from the inside of the film due to cleavage of the film was counted. Using (the number of all squares— the number of squares Peeled off from the inside of the film due to cleavage of the film) as the numerator and the number of all squares as the denominator, the evaluation was performed according to the following criteria. Of the squares, those with cleavage of only a Part of the film were also counted as squares in which the cleavage of the film occurred; however, those peeled off from the hard coating layer surface were not counted as squares in which the cleavage of the film occurred.

A: 61/100 or more and 100/100 or less
B: 50/100 or more and 60/100 or less
C: less than 50/100

The peeled interface of the peeled squares can be confirmed by episcopic differential interference contrast observation using an industrial microscope ECLIPSE (LV100ND) produced by Nikon Instech Co., Ltd. with an objective lens magnification of 5× or 10×.

Coating Solution for Forming Hard Coating Layer: U-1

95 parts by mass of a urethane acrylate-based hard coating agent (Beamset (registered trademark) 577 produced by Arakawa Chemical Industries, Ltd., solids content: 100%), 5 parts by mass of a photopolymerization initiator (Irgacure (registered trademark) 184 produced by BASF Japan, solids content: 100%), and 0.1 parts by mass of a leveling agent (BYK307 produced by BYE Chemie Japan, solid content: 100%) were mixed, and the mixture was diluted with a solvent of cyclohexanone/toluene/MEK=1/3/6, thereby preparing a coating solution (U-1) for forming a hard coating layer having a solids content of 40%.

(7) Observation of Rainbow Unevenness

A polyethylene terephthalate-based resin film produced by the method described below was bonded to one side of a polarizing film comprising PVA and iodine so that the absorption axis of the polarizing film was vertical to the main orientation axis of the polyethylene terephthalate film, and a commercially available TAC film was bonded to the opposite side of the polarizing film, thereby obtaining a polarizer. The polarizer on the light-outgoing side that was originally present in a commercially available liquid crystal display device (LC32DZ3 produced by Sharp Corporation) was replaced with the polarizer obtained above so that the absorption axis of the polarizer obtained above coincided with the absorption axis direction of the polarizer originally attached to the liquid crystal display device and so that the polyethylene terephthalate-based resin film was on the viewing side. The liquid crystal display device has a white LED with a light-emitting device obtained by combining an yttrium-aluminum-garnet yellow phosphor with a blue-light-emitting diode as a backlight light source.

A white image was displayed on the liquid crystal display device prepared in the above manner. The display was visually observed from the front direction and an oblique direction, and the occurrence of rainbow unevenness was determined as follows. The observation angle was defined as the angle between a line extending from the center of the screen of the display in the normal (perpendicular) direction and a line connecting the center of the display and the position of the eye during observation.

A: No rainbow unevenness observed in the observation angle range of 0 to 60 degrees.
B: Partial, light rainbow unevenness observed in the observation angle range of 0 to 60 degrees.
C: Clear rainbow unevenness observed in the observation angle range of 0 to 60 degrees.

Production Example 1: Polyester A

The temperature of an esterification reaction vessel was raised, and when the temperature reached 200° C., 86.4 parts by mass of terephthalic acid and 64.6 parts by mass of ethylene glycol were put in the vessel. While stirring the mixture, 0.017 parts by mass of antimony trioxide, 0.064 parts by mass of magnesium acetate tetrahydrate, and 0.16 parts by mass of triethylamine were added as catalysts. Subsequently, the pressure and temperature were raised, and pressure esterification was performed at a gauge pressure of 0.34 MPa at 240° C. Then, the pressure in the esterification reaction vessel was returned to normal pressure, and 0.014 parts by mass of phosphoric acid was added. Further, the temperature was raised to 260° C. over 15 minutes, and 0.012 parts by mass of trimethyl phosphate was added. Subsequently, after 15 minutes, dispersion was performed with a high-pressure disperser. After 15 minutes, the obtained esterification reaction product was transferred to a polycondensation reaction vessel, and a polycondensation reaction was performed at 280° C. under reduced pressure.

After completion of the polycondensation reaction, filtration was performed using a Naslon filter (95% cut size: 5 μm). The resultant was extruded through a nozzle into a strand shape, cooled and solidified with cooling water, which had been filtered beforehand (pore size: 1 μm or less), and cut into pellets. The obtained polyethylene terephthalate resin (A) had an intrinsic viscosity of 0.62 dl/g and did not substantially contain inert particles and internally deposited particles (hereafter abbreviated as "PET (A)").

Production Example 2: Polyester B 10 parts by mass of a dried ultraviolet absorber (2,2'-(1, 4-phenylene)bis(4H-3,1-benzoxazin-4-one) and 90 parts by mass of particle-free PET (A) (intrinsic viscosity: 0.62 dl/g) were mixed, and a kneading extruder was used to obtain a polyethylene terephthalate resin (B) containing the ultraviolet absorber (hereafter abbreviated as "PET (B)").

Production Example 3: Preparation of Adhesion-Modified Coating Solution

A transesterification reaction and a polycondensation reaction were performed in a standard manner to prepare a water-dispersible sulfonic acid metal salt group-containing copolymerized polyester resin comprising, as dicarboxylic acid components (based on the entire dicarboxylic acid components), 46 mol % of terephthalic acid, 46 mol % of isophthalic acid, and 8 mol % of sodium 5-sulfonatoisophthalate; and as glycol components (based on the entire glycol components), 50 mol % of ethylene glycol and 50 mol'; of neopentyl glycol. Subsequently, 51.4 parts by mass of water, 38 parts by mass of isopropyl alcohol, 5 parts by mass of n-butyl cellosolve, and 0.06 parts by mass of nonionic surfactant were mixed, and then stirred under heating. When the temperature reached 77° C., 5 parts by mass of the above water-dispersible sulfonic acid metal salt group-containing copolymerized polyester resin was added, and continuously stirred until the mass of the resin disappeared. Thereafter, the resulting resin aqueous dispersion was cooled to room temperature, thereby obtaining a homogeneous water-dispersible copolymerized polyester resin solution with a solids content of 5.0 mass %. Furthermore, 3 parts by mass of aggregate silica particles (Sylysia 310, produced by Fuji Silysia Chemical Ltd.) was dispersed in 50 parts by mass of water. Then, 0.54 parts by mass of the water dispersion of Sylysia 310 was added to 99.46 parts by mass of the above water-dispersible copolymerized Polyester resin solution. While stirring the mixture, 20 parts by mass of water was added, thereby obtaining an adhesion-modified coating solution.

Example 1

As the starting materials for the base film intermediate layer, 90 parts by mass of particle-free PET (A) resin pellets and 10 parts by mass of ultraviolet absorber-containing PET (B) resin pellets were dried under reduced pressure (1 Torr) at 135° C. for 6 hours, and then supplied to an extruder 2 (for the intermediate layer II). Further, PET (A) was dried by a standard method, supplied to extruders 1 (each for the outer layer I and the outer layer III), and melted at 285° C. These two polymers were each filtered through a filtering medium of a stainless steel sintered body (nominal filtering accuracy: 10 μm-particle 95% cut), laminated by two types of three-layered junction blocks, and extruded through a die into a sheet-like shape. The resulting sheet was cooled and solidified by winding the sheet around a casting drum with a surface temperature of 30° C. by an electrostatic casting method, thereby forming an unstretched film. At this time, the discharge of each extruder was adjusted so that the thickness ratio of layer I, layer II, and layer III was 10:80:10.

Then, the adhesion-modified coating solution prepared above was applied to both sides of the unstretched PET film by reverse-roll coating so that the amount of dried coating was 0.08 g/m², followed by drying at 80° C. for 20 seconds.

The unstretched film, on which a coating layer had been formed, was guided to a tenter stretching machine. While the edges of the film were held with clips, the film was guided to a hot-air zone with a temperature of 138° C. for preheating, and then stretched at a temperature of 90° C. and a strain rate of 17.2%/sec so as to be stretched 5.0 times in the width direction. Subsequently, while the width of the film stretched in the width direction was maintained, the film was heat-treated in a hot-air zone with a temperature of 210° C., then guided to a hot-air zone with a temperature of 160° C., and further subjected to 3% relaxation treatment in the width direction. Thus, a uniaxially oriented PET film with a thickness of about 65 μm was obtained.

Example 2

An unstretched film (on which a coating layer had been formed) prepared in the same manner as in Example 1 was guided to a tenter stretching machine. While the edges of the film were held with clips, the film was guided to a hot-air zone with a temperature of 132° C. for preheating, and then stretched at a temperature of 90° C. and a strain rate of 17.2%/sec so as to be stretched 5.0 times in the width direction. Subsequently, while the width of the film stretched in the width direction was maintained, the film was heat-treated in a hot-air zone with a temperature of 210° C., then guided to a hot-air zone with a temperature of 160° C., and further subjected to 3% relaxation treatment in the width direction. Thus, a uniaxially oriented PET film with a thickness of about 65 μm was obtained.

Example 3

An unstretched film (on which a coating layer had been formed) prepared in the same manner as in Example 1, except that the film thickness was changed, was guided to a tenter stretching machine. While the edges of the film were held with clips, the film was guided to a hot-air zone with a temperature of 130° C. for preheating, and then stretched at a temperature of 90° C. and a strain rate of 20.0%/sec so as to be stretched 5.8 times in the width direction. Subsequently, while the width of the film stretched in the width direction was maintained, the film was heat-treated in a hot-air zone with a temperature of 200° C., then guided to a hot-air zone with a temperature of 140° C., and further subjected to 3% relaxation treatment in the width direction. Thus, a uniaxially oriented PET film with a thickness of about 40 μm was obtained.

Example 4

An unstretched film (on which a coating layer had been formed) prepared in the same manner as in Example 1, except that the film thickness was changed, was guided to a tenter stretching machine. While the edges of the film were held with clips, the film was guided to a hot-air zone with a temperature of 120° C. for preheating, and then stretched at a temperature of 102° C. and a strain rate of 39.3%/sec so as to be stretched 5.6 times in the width direction. Subsequently, while the width of the film stretched in the width direction was maintained, the film was heat-treated in a hot-air zone with a temperature of 180° C., then guided to a hot-air zone with a temperature of 160° C., and further subjected to 3% relaxation treatment in the width direction. Thus, a uniaxially oriented PET film with a thickness of about 50 μm was obtained.

Example 5

An unstretched film (on which a coating layer had been formed) prepared in the same manner as in Example 1, except that the film thickness was changed, was guided to a tenter stretching machine. While the edges of the film were held with clips, the film was guided to a hot-air zone with a temperature of 100° C. for preheating, and then stretched at a temperature of 90° C. and a strain rate of 25.2%/sec so as to be stretched 4.5 times in the width direction. Subsequently, while the width of the film stretched in the width direction was maintained, the film was heat-treated in a hot-air zone with a temperature of 200° C., then guided to a hot-air zone with a temperature of 160° C., and further subjected to 3% relaxation treatment in the width direction. Thus, a uniaxially oriented PET film with a thickness of about 60 μm was obtained.

Comparative Example 1

An unstretched film (on which a coating layer had been formed) prepared in the same manner as in Example 1, except that the film thickness was changed, was guided to a tenter stretching machine. While the edges of the film were held with clips, the film was guided to a hot-air zone with a temperature of 100° C. for preheating, and then stretched at a temperature of 100° C. and a strain rate of 34.6%/sec so as to be stretched 5.0 times in the width direction. Subsequently, while the width of the film stretched in the width direction was maintained, the film was heat-treated in a hot-air zone with a temperature of 180° C., then guided to a hot-air zone with a temperature of 180° C., and further subjected to 3% relaxation treatment in the width direction. Thus, a uniaxially oriented PET film with a thickness of about 60 μm was obtained.

Comparative Example 2

A uniaxially oriented PET film with a thickness of about 65 μm was obtained in the same manner as in Example 2, except that the temperature during stretching was changed to 80° C.

Comparative Example 3

An unstretched film (on which a coating layer had been formed) prepared in the same manner as in Example 1, except that the film thickness was changed, was guided to a tenter stretching machine. While the edges of the film were held with clips, the film was guided to a hot-air zone with a temperature of 138° C. for preheating, and then stretched at a temperature of 90° C. and a strain rate of 49.2%/sec so as to be stretched 5.8 times in the width direction. Subsequently, while the width of the film stretched in the width direction was maintained, the film was heat-treated in a hot-air zone with a temperature of 190° C., then guided to a hot-air zone with a temperature of 190° C., and further subjected to 3% relaxation treatment in the width direction. Thus, a uniaxially oriented PET film with a thickness of about 50 μm was obtained.

Comparative Example 4

An unstretched film (on which a coating layer had been formed) prepared in the same manner as in Example 1, except that the film thickness was changed, was guided to a tenter stretching machine. While the edges of the film were held with clips, the film was guided to a hot-air zone with a temperature of 115° C. for preheating, and then stretched at a temperature of 102° C. and a strain rate of 39.3%/sec so as to be stretched 5.6 times in the width direction. Subsequently, while the width of the film stretched in the width direction was maintained, the film was heat-treated in a hot-air zone with a temperature of 180° C., then guided to a hot-air zone with a temperature of 180° C., and further subjected to 3% relaxation treatment in the width direction. Thus, a uniaxially oriented PET film with a thickness of about 25 μm was obtained.

Table 1 shows the measurement results of the PET films obtained in the Examples and Comparative Examples.

TABLE 1

| | Thickness (μm) | Preheating temperature (° C.) | Stretching temperature (° C.) | Width-direction stretch ratio | Strain rate (%/sec) | High-temperature heat treatment temperature (° C.) | Low-temperature heat treatment temperature (° C.) | Retardation (nm) |
|---|---|---|---|---|---|---|---|---|
| Ex. 1 | 65 | 138 | 90 | 5.0 | 17.2 | 210 | 160 | 7437 |
| Ex. 2 | 65 | 132 | 90 | 5.0 | 17.2 | 210 | 160 | 7684 |
| Ex. 3 | 40 | 130 | 90 | 5.8 | 20.0 | 200 | 140 | 4800 |
| Ex. 4 | 50 | 120 | 102 | 5.6 | 39.3 | 180 | 160 | 6147 |
| Ex. 5 | 60 | 100 | 90 | 4.5 | 25.2 | 200 | 160 | 6575 |
| Comp. Ex. 1 | 60 | 100 | 100 | 5.0 | 34.6 | 180 | 180 | 7181 |
| Comp. Ex. 2 | 65 | 132 | 80 | 5.0 | 17.2 | 210 | 160 | 7241 |
| Comp. Ex. 3 | 50 | 138 | 90 | 5.8 | 49.2 | 190 | 190 | 6292 |
| Comp. Ex. 4 | 25 | 115 | 102 | 5.6 | 39.3 | 180 | 180 | 2588 |

TABLE 1-continued

| | Amorphous orientation parameter | Breaking strength in slow axis direction (MPa) | ΔP | Rigid amorphous fraction (mass %) | Mobile amorphous fraction (mass %) | Mass fraction crystallinity (mass %) | Cross-cut evaluation | Rainbow unevenness observation |
|---|---|---|---|---|---|---|---|---|
| Ex. 1 | 0.377 | 318 | 0.117 | 35.3 | 30.5 | 34.2 | A | A |
| Ex. 2 | 0.336 | 363 | 0.126 | 33.6 | 30.1 | 36.2 | A | A |
| Ex. 3 | 0.357 | 391 | 0.121 | 38.2 | 25.5 | 36.3 | A | B |
| Ex. 4 | 0.351 | 412 | 0.126 | 41.2 | 25.0 | 33.8 | A | A |
| Ex. 5 | 0.390 | 378 | 0.131 | 33.8 | 33.5 | 32.7 | B | B |
| Comp. Ex. 1 | 0.329 | 372 | 0.137 | 39.2 | 27.3 | 33.5 | C | B |
| Comp. Ex. 2 | 0.329 | 373 | 0.136 | 32.2 | 30.7 | 37.1 | C | B |
| Comp. Ex. 3 | 0.316 | 504 | 0.139 | 39.4 | 25.2 | 35.4 | C | B |
| Comp. Ex. 4 | 0.297 | 498 | 0.139 | 39.1 | 25.4 | 35.5 | C | C |

INDUSTRIAL APPLICABILITY

The present invention can provide a polyethylene terephthalate-based resin film that has excellent processing suitability and that particularly can effectively suppress the occurrence of cleavage in the film layer of a portion cut with a knife. The present invention can also provide a polarizer, a transparent conductive film, a touch panel, and image display devices such as a liquid crystal display device and an organic EL display device, all of which use the polyethylene terephthalate-based resin film.

The invention claimed is:

1. A polyethylene terephthalate-based resin film satisfying the following (1) and (2):
   (1) the polyethylene terephthalate-based resin film has a retardation of 3,000 nm to 30,000 nm; and
   (2) the polyethylene terephthalate-based resin film has an amorphous orientation parameter of 0.330 or more as measured by an ATR-FTIR method, the amorphous orientation parameter being represented by the following equation:

$$(\text{amorphous orientation parameter}) = R_{slow}/R_{fast}$$

wherein $R_{slow}$ is (absorbance at 1372 cm$^{-1}$ in slow axis direction)/(absorbance at 795 cm$^{-1}$ in slow axis direction), and $R_{fast}$ is (absorbance at 1372 cm$^{-1}$ in fast axis direction)/(absorbance at 795 cm$^{-1}$ in fast axis direction).

2. The polyethylene terephthalate-based resin film according to claim 1, further satisfying the following (3):
   (3) the polyethylene terephthalate-based resin film has a breaking strength of 450 MPa or less in the slow axis direction.

3. The polyethylene terephthalate-based resin film according to claim 1, further satisfying the following (4):

(4) the polyethylene terephthalate-based resin film has a plane orientation coefficient ΔP of 0.135 or less.

4. The polyethylene terephthalate-based resin film according to claim 1, further satisfying the following (5):
   (5) the polyethylene terephthalate-based resin film has a rigid amorphous fraction of 33 mass % or more, the rigid amorphous fraction being represented by the following equation:

(rigid amorphous fraction (mass %))=100−(mobile amorphous fraction (mass %))−(mass fraction crystallinity (mass %)).

5. A polarizer comprising a polarizing film and the polyethylene terephthalate-based resin film according to claim 1 laminated as a protective film on at least one surface of the polarizing film.

6. An image display device comprising the polarizer according to claim 5.

7. A liquid crystal display device comprising a backlight light source, two polarizers, and a liquid crystal cell disposed between the two polarizers, at least one of the two polarizers being the polarizer according to claim 5.

8. An organic EL display device comprising the polarizer according to claim 5.

9. A transparent conductive film comprising the polyethylene terephthalate-based resin film according to claim 1 as a base film of the transparent conductive film.

10. A touch panel comprising the transparent conductive film according to claim 9.

11. An image display device comprising an image display panel and the polyethylene terephthalate-based resin film according to claim 1 as a scattering prevention film or a surface protection film on a viewing side of the image display panel.

* * * * *